United States Patent

Suzuka et al.

(10) Patent No.: US 10,629,384 B2
(45) Date of Patent: Apr. 21, 2020

(54) PHOTOABSORBER AND SOLAR CELL COMPRISING THE SAME

(71) Applicant: Panasonic Intellectual Property Management Co., Ltd., Osaka (JP)

(72) Inventors: Michio Suzuka, Kyoto (JP); Tomoyasu Yokoyama, Osaka (JP); Taisuke Matsui, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/200,698

(22) Filed: Nov. 27, 2018

(65) Prior Publication Data

US 2019/0221374 A1 Jul. 18, 2019

(30) Foreign Application Priority Data

Jan. 17, 2018 (JP) .................. 2018-005652

(51) Int. Cl.
*H01G 9/20* (2006.01)
*H01L 51/42* (2006.01)
*H01L 51/00* (2006.01)

(52) U.S. Cl.
CPC ......... *H01G 9/2009* (2013.01); *H01L 51/002* (2013.01); *H01L 51/4226* (2013.01); *H01L 2251/308* (2013.01)

(58) Field of Classification Search
CPC .................................................. H01G 9/2009
See application file for complete search history.

(56) References Cited

U.S. PATENT DOCUMENTS

| | | |
|---|---|---|
| 2015/0340632 A1 | 11/2015 | Etgar |
| 2018/0096798 A1* | 4/2018 | Satou .................. H01G 9/0029 |
| 2018/0239034 A1* | 8/2018 | Tian ...................... G01T 1/2018 |
| 2018/0277309 A1* | 9/2018 | Etgar .................. H01L 51/4213 |
| 2018/0286923 A1* | 10/2018 | Fischer .................... G21K 4/00 |

FOREIGN PATENT DOCUMENTS

| | | |
|---|---|---|
| JP | 2016-502282 | 1/2016 |
| JP | 2016-178290 | 10/2016 |
| JP | 2016178290 | * 10/2016 |

OTHER PUBLICATIONS

Shuyan Shao et al., "Highly Reproducible Sn-Based Hybrid Perovskite Solar Cells with 9% Efficiency", Advanced Energy Materials, 2018, vol. 8, 1702019, Sep. 22, 2017.

* cited by examiner

Primary Examiner — Jayne L Mershon
(74) Attorney, Agent, or Firm — McDermott Will & Emery LLP

(57) ABSTRACT

The present disclosure provides a photoabsorber containing:
a perovskite compound represented by the composition formula $ABX_3$,
where
A represents a monovalent cation,
B represents a divalent cation including a Sn cation, and
X represents a halogen anion; and
a trivalent cation of a Group 3 element.

3 Claims, 8 Drawing Sheets

PHOTOABSORBER AND SOLAR CELL COMPRISING THE SAME

BACKGROUND

1. Technical Field

The present disclosure relates to a photoabsorber and a solar cell comprising the same.

2. Description of the Related Art

A perovskite solar cell has been recently researched and developed. In the perovskite solar cell, a perovskite compound formed of a perovskite crystal structure represented by the composition formula $ABX_3$ (where A is a monovalent cation, B is a divalent cation, and X is a halogen anion) or a structure similar thereto is used as a photoabsorber.

Non-Patent Literature 1 discloses that a perovskite compound represented by $CH_3NH_3SnI_3$ (hereinafter, referred to as "$MASnI_3$") is used as a photoabsorber of the perovskite solar cell. Non-Patent Literature 1 also discloses a perovskite compound represented by $(NH_2)_2CHSnI_3$ (hereinafter, referred to as "$FASnI_3$"). In the instant specification, a perovskite compound containing Sn is referred to as "Sn-type perovskite compound".

CITATION LIST

Non-Patent Literature

Non-Patent Literature 1: Shuyan Shao et al., "Highly Reproducible Sn-Based Hybrid Perovskite Solar Cells with 9% Efficiency", Advanced Energy Materials, 2018, Vol. 8, 1702019, Sep. 22, 2017

SUMMARY

An object of the present disclosure is to provide a photoabsorber capable of improving conversion efficiency of the solar cell containing the Sn-type perovskite compound.

The present disclosure provides a photoabsorber containing:

a perovskite compound represented by the composition formula $ABX_3$, where

A represents a monovalent cation,

B represents a divalent cation including a Sn cation, and

X represents a halogen anion; and a trivalent cation of a Group 3 element.

The present disclosure provides a photoabsorber capable of improving conversion efficiency of the perovskite solar cell.

DETAILED DESCRIPTION OF THE EMBODIMENT

Hereinafter, the embodiment of the present disclosure will be described with reference to the drawings.

(Findings which Established the Foundation of the Present Disclosure)

The findings which established the foundation of the present disclosure will be described below.

It is known that a Sn-type perovskite compound is one of suitable materials used as a photoabsorber of a solar cell, since the Sn-type perovskite compound has a bandgap in the vicinity of 1.4 eV. However, it is also known in the Sn-type perovskite compound that a part of the B site occupied by $Sn^{2+}$ is a vacancy and that the vacancy generates holes which are p-type carriers.

Figure 1:
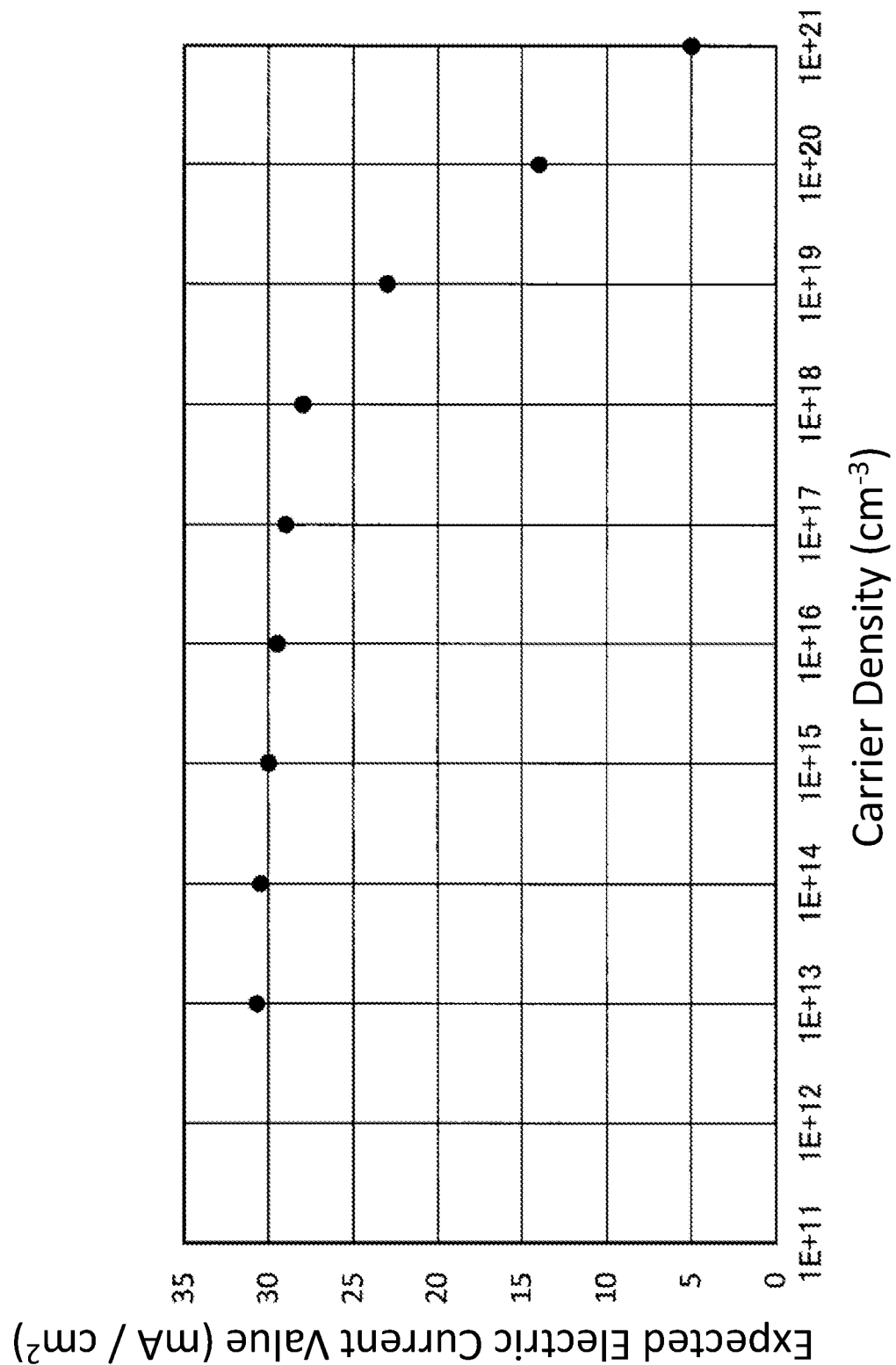
FIG. 1 is a graph showing a relation between carrier density of a photoabsorber layer containing the Sn-type perovskite compound and an electric current value of a solar cell comprising the photoabsorber layer.

FIG. 1 is a graph showing a relation between carrier density of a photoabsorber layer containing the Sn-type perovskite compound and an electric current value of a solar cell comprising the photoabsorber layer. The relation is calculated with a device simulation performed on the basis of consideration by the present inventors. In FIG. 1, the horizontal axis and the vertical axis indicate the carrier density and the electric current value, respectively. As is clear from FIG. 1, as the carrier density contained in the perovskite compound is increased due to generation of the $Sn^{2+}$ vacancies, the electric current value of the solar cell is lowered.

The present inventors found that cancel of the vacancies derived from $Sn^{2+}$ allows the electric current value of the Sn-type perovskite compound to be increased. The present inventors have achieved a photoabsorber and a solar cell using the photoabsorber on the basis of the above findings.

(Composition and Crystal Structure of Perovskite Compound)

The photoabsorber according to the present embodiment contains a perovskite compound represented by the composition formula $ABX_3$ and a trivalent cation of a Group 3 element. In the perovskite compound, A represents a monovalent cation, B represents a divalent cation including a Sn cation, and X represents a halogen anion. Hereinafter, such a perovskite compound is referred to as the perovskite compound according to the present embodiment. Pursuant to the expression used conventionally for the perovskite compound, A, B, and X are referred to as "A site", "B site", and "X site" in the instant specification, respectively. In the instant specification, the word "photoabsorber" means "light absorbing material". In addition, the photoabsorber serves as a photoelectric conversion material.

The perovskite compound according to the present embodiment has a perovskite crystal structure represented by the composition formula $ABX_3$. In the perovskite compound according to the present embodiment, for example, X is a halogen anion. In the perovskite compound according to the present embodiment, for example, the monovalent cation is located at the A site, $Sn^{2+}$ is located at the B site, and the halogen anion is located at the X site.

The monovalent cation located at the A site is not particularly limited. An example of the monovalent cation is an organic cation or an alkali metal cation. For example, the monovalent cation includes at least one selected from the group consisting of a methylammonium cation (i.e., $CH_3NH_3^+$), a formamidinium cation (i.e., $NH_2CHNH_2^+$), a cesium cation ($Cs^+$), a phenylethylammonium cation ($C_6H_5C_2H_4NH_3^+$), and a guanidinium cation ($CH_6N_3^+$). The monovalent cation is, for example, a formamidinium cation. The halogen anion located at the X site is, for example, an iodide anion. Each of the A site, the B site, and the X site may be occupied by plural kinds of ions.

The trivalent cation of the Group 3 element is present in the photoabsorber. The trivalent cation of the Group 3 element may be dispersed in the state of the fine-particle salt thereof or may be segregated in a part of the photoabsorber, as long as the trivalent cation of the Group 3 element is present in the photoabsorber. The trivalent cation of the Group 3 element may be contained in the perovskite compound. The trivalent cation of the Group 3 element may be present in the state where a part of the A site or the B site of the perovskite compound of the present embodiment is occupied by the trivalent cation of the Group 3 element.

When the trivalent cation of the Group 3 element is present at the part of the B site of the perovskite compound, electrons which serve as n-type carriers are generated, since the trivalent cation of the Group 3 element has a large valence than a divalent cation (namely, $Sn^{2+}$) by which the B site of the typical perovskite compound is occupied. In this way, holes which serve as p-type carrier and have been generated by the vacancies of $Sn^{2+}$ are canceled. As a result, a perovskite film having low carrier density is provided. Also in the case where the part of the A site of the perovskite compound is occupied by the trivalent cation of the Group 3 element, a perovskite film having low carrier density is provided.

The trivalent cation of the Group 3 element is not particularly limited. An example of the trivalent cation of the Group 3 element is yttrium or scandium.

In the photoabsorber according to the present embodiment, a molar ratio of the trivalent cation of the Group 3 element to the Sn cation may be more than 0.0002 and not more than 0.02, may be not less than 0.0003 and not more than 0.02, or may be not less than 0.002 and not more than 0.02.

The photoabsorber according to the present embodiment contains the perovskite compound according to the present embodiment mainly; however, may contain impurities. A weight ratio of the perovskite compound to the photoabsorber may be not less than 80 mass %. The photoabsorber according to the present embodiment may further contain a compound other than the perovskite compound according to the present embodiment.

(Property of Perovskite Compound)

The perovskite compound according to the present embodiment exhibits useful properties as the photoabsorber which is used for the solar cell. The perovskite compound according to the present embodiment has a long fluorescence lifetime.

The word "fluorescence lifetime" means a lifetime of fluorescence generated upon the recombination of the electrons and holes after the charge isolation. The electrons and holes are present in the conduction band and in the valence band, respectively. The fluorescence lifetime can be measured with a near-infrared fluorescence lifetime measurement device comprising a YAG laser. The perovskite compound is irradiated with light emitted by the YAG laser to emit excitation light. The time-dependent change of the excitation light is measured in the near-infrared fluorescence lifetime measurement device.

Figure 2A:
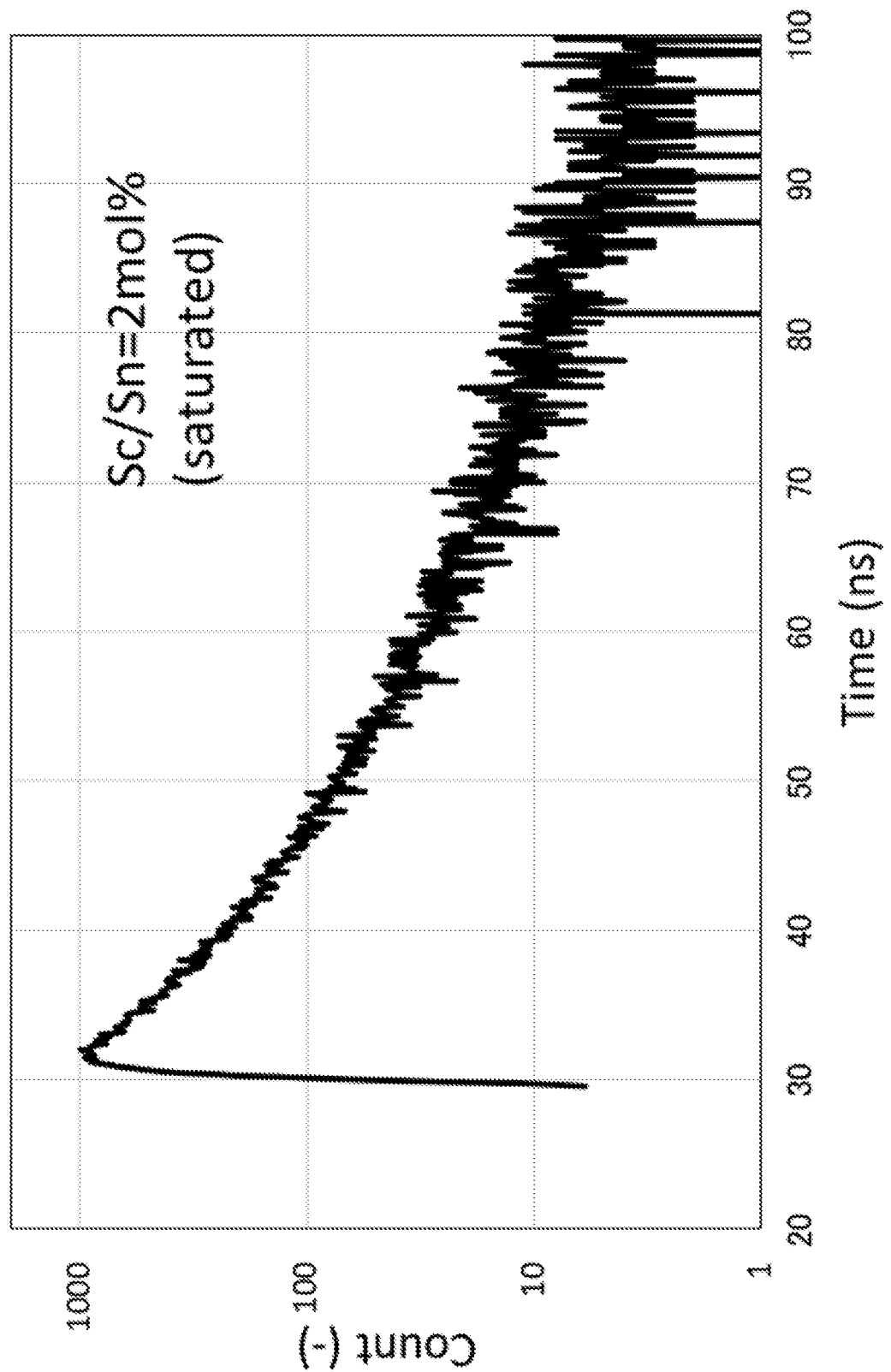
FIG. 2A is a graph showing the fluorescence lifetime of the perovskite compound which has been doped with Sc ions at a Sc/Sn doping molar ratio of 0.02.

FIG. 2A is a graph showing the fluorescence lifetime of the perovskite compound which has been doped with Sc ions at a Sc/Sn doping molar ratio of 0.02. The perovskite compound of FIG. 2A is contained in the photoabsorber layer of the solar cell according to the inventive example 6, which will be described later. In other words, FIG. 2A is a graph showing the fluorescence lifetime measurement result of the inventive example 6.

Figure 2B:
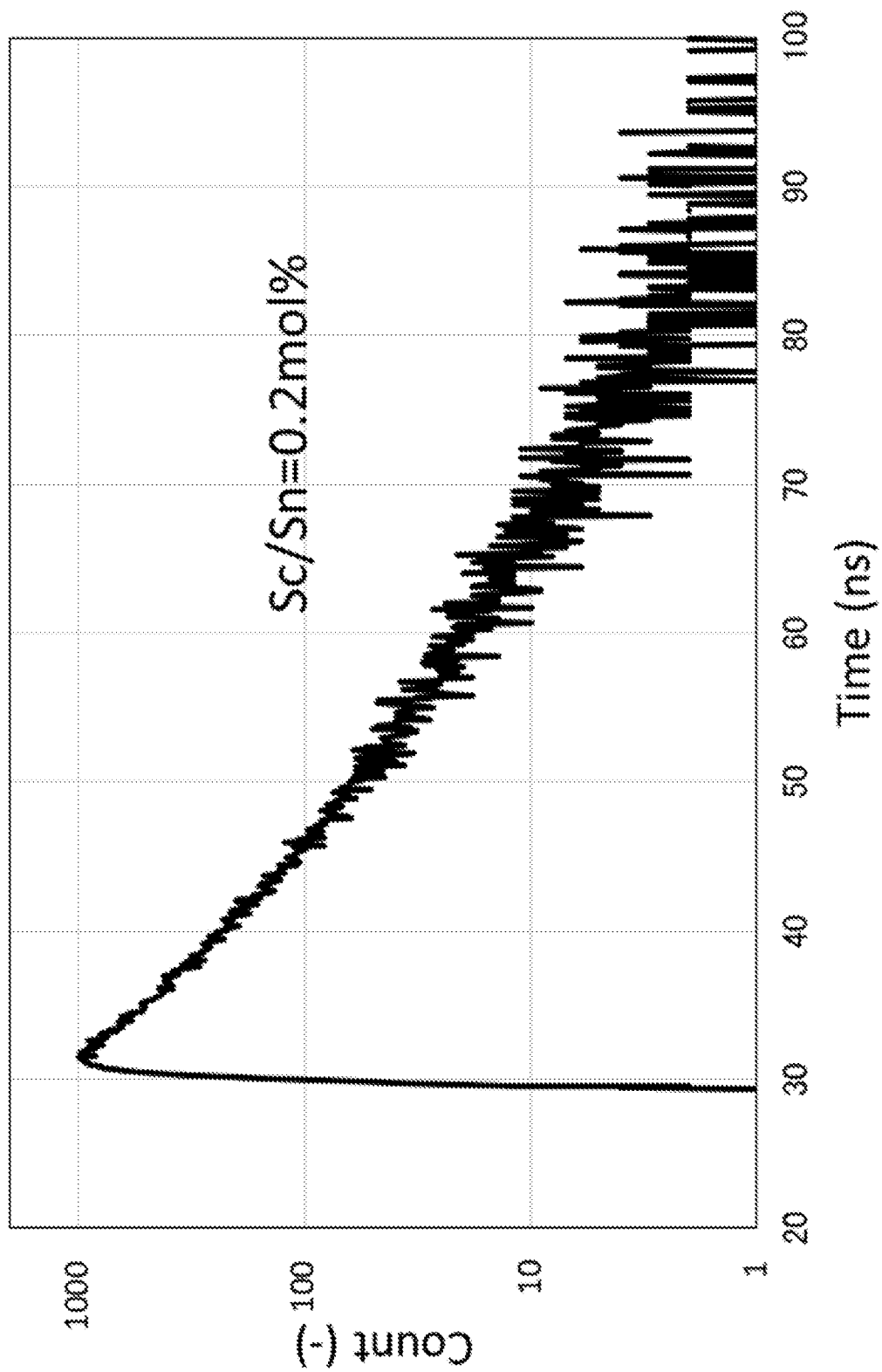
FIG. 2B is a graph showing the fluorescence lifetime of the perovskite compound which has been doped with Sc ions at a Sc/Sn doping molar ratio of 0.002.

FIG. 2B is a graph showing the fluorescence lifetime of the perovskite compound which has been doped with Sc ions at a Sc/Sn doping molar ratio of 0.002. The perovskite compound of FIG. 2B is contained in the photoabsorber layer of the solar cell according to the inventive example 4, which will be described later. In other words, FIG. 2B is a graph showing the fluorescence lifetime measurement result of the inventive example 4.

Figure 2C:
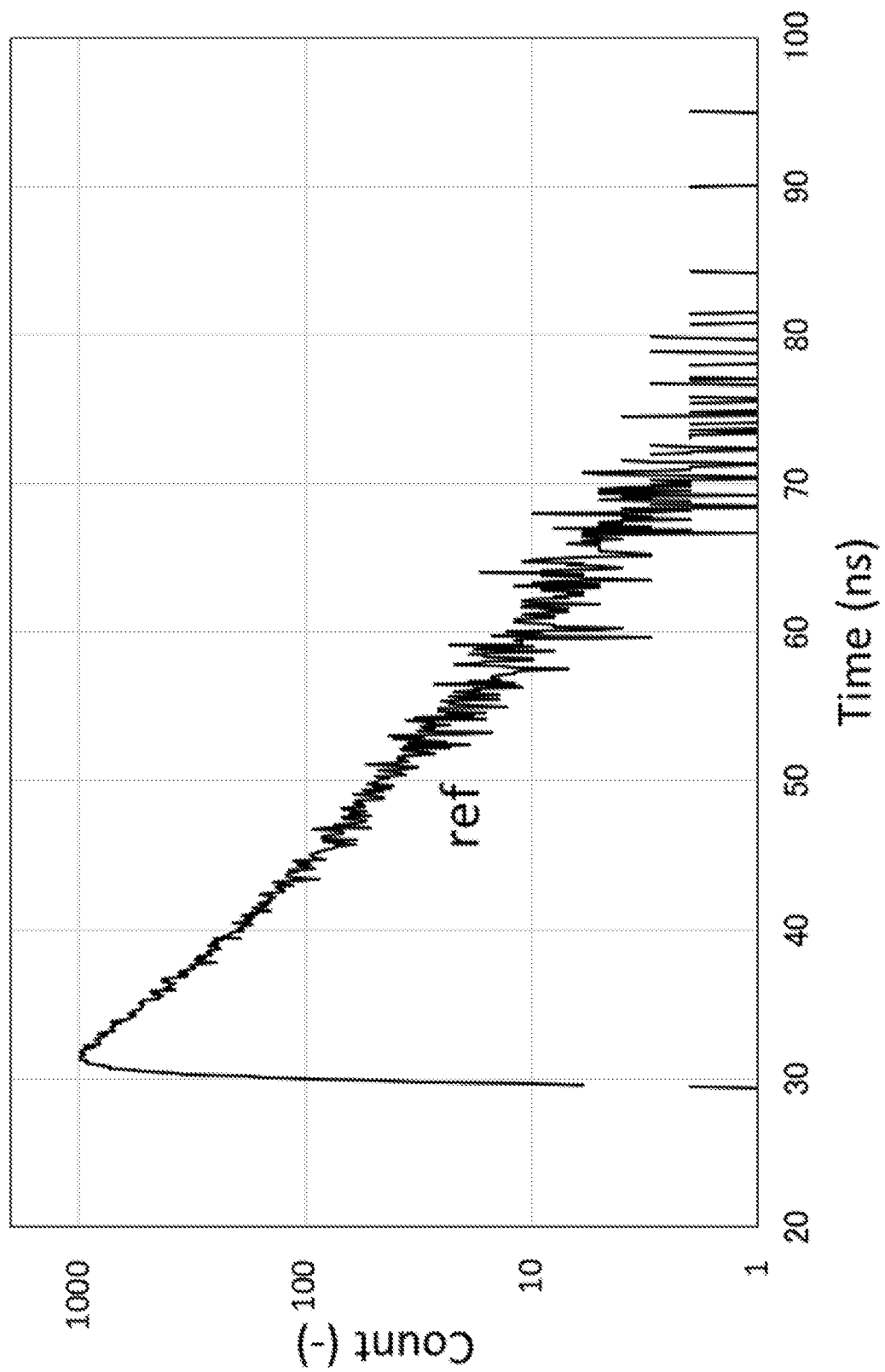
FIG. 2C is a graph showing the fluorescence lifetime of the perovskite compound which has not been doped with Sc ions (i.e., the Sc/Sn doping molar ratio is 0.0).

FIG. 2C is a graph showing the fluorescence lifetime of the perovskite compound which has not been doped with Sc ions (i.e., the Sc/Sn doping molar ratio is 0.0). The perovskite compound of FIG. 2C is contained in the photoabsorber layer of the solar cell according to the comparative example 1, which will be described later. In other words, FIG. 2C is a graph showing the fluorescence lifetime measurement result of the comparative example 1.

FIG. 2A-2C are output results from the near-infrared fluorescence lifetime measurement device (product of Hamamatsu Photonics K. K., trade name: C7990).

In FIG. 2A-2C, the incline of the line indicates the length of the fluorescence lifetime. As the incline is gentler, the fluorescence lifetime is longer. As is clear from FIG. 2A-2C, as the perovskite compound is doped more with Sc ions, the fluorescence lifetime is longer. The fluorescence lifetime of the photoabsorber according to the present embodiment falls, for example, within a range of not less than 5 nanoseconds and not more than 20 nanoseconds.

(Method for Measuring Content of Trivalent Cations of Group 3 Element)

The content of the trivalent cations of the Group 3 element contained in the photoabsorber can be measured by an X-ray photoelectron spectroscopy method (hereinafter, referred to as "XPS") or an inductively coupled plasma atomic emission spectroscopic analysis method (hereinafter, referred to as "ICP-AES"). In the XPS method, the solar cell is broken so as to expose a surface of the photoabsorber layer included in the solar cell. Then, the surface of the photoabsorber layer is irradiated with an X-ray to measure the content of the trivalent cations of the Group 3 element. In the ICP-AES method, the photoabsorber layer is dissolved using a solvent of capable of dissolving the perovskite compound to measure the content of the trivalent cations of the Group 3 element. An example of the solvent is dimethylsulfoxide (hereinafter, referred to as "DMSO").

The cross section of the photoabsorber layer is observed with a transmission electron microscope (hereinafter, referred to as "TEM") to determine whether or not the trivalent cation of the Group 3 element is present at the B site of the perovskite compound according to the present embodiment.

(Fabrication Method of Photoabsorber)

Hereinafter, a fabrication method of the perovskite compound according to the present embodiment will be described. The fabrication method of the perovskite compound according to the present embodiment is not particularly limited. Now, a fabrication method by an inverse temperature crystallization (hereinafter, referred to as "ITC") method will be described.

First, $SnI_2$ and $HC(NH_2)_2I$ (namely, FAI) are added to an organic solvent to prepare a mixture solution. The molar number of $SnI_2$ is equal to that of FAI. An example of the organic solvent is a mixture in which dimethylsulfoxide (namely, DMSO):N,N-dimethylformamide (namely, DMF) is mixed at a volume ratio of 1:1.

Next, using a heating device such as a hot plate, the mixture solution is heated to a temperature which falls within a range of not less than 40 degrees Celsius and not more than 120 degrees Celsius to dissolve $SnI_2$ and FAI. In this way, a first solution is provided. Subsequently, the provided first solution is left at rest at room temperature.

Apart from the above, $SnI_2$, FAI, and a salt of the trivalent cation of the Group 3 element are added to an organic solvent to prepare a mixture solution. An example of the organic solvent is γ-valerolactone (hereinafter, referred to as "GVL"). An example of the salt of the trivalent cation of the Group 3 element is an iodide, a fluoride, a chloride, or a bromide. An example of the iodide is $ScI_3$ or $YI_3$. An example of the fluoride is $ScF_3$ and $YF_3$. An example of the chloride is $ScCl_3$. An example of the bromide is $ScBr_3$. The molar concentration of $ScI_2$ may be not less than 0.8 mol/L and not more than 2.0 mol/L, or may be not less than 0.8 mol/L and not more than 1.0 mol/L. The molar concentration of FAI may be not less than 0.4 mol/L and not more than 2.0 mol/L, or may be not less than 0.4 mol/L and not more than 1.0 mol/L. The molar ratio of the salt of the trivalent cation of the Group 3 element may be more than 0 mol/L and not more than 1.0 mol/L, or may be more than 0 mol/L and not more than 0.5 mol/L.

Next, using the heating device, the mixture solution is heated to a temperature which falls within a range of not less than 40 degrees Celsius and not more than 180 degrees Celsius to dissolve $SnI_2$, FAI, and the salt of the trivalent cation of the Group 3 element in the organic solvent. In this way, a second solution is provided. Subsequently, the provided second solution is left at rest at room temperature.

The first solution is applied to a glass substrate by a spin coat method. Then, the substrate is heated to a temperature which falls within a range of not less than 60 degrees Celsius and not more than 180 degrees Celsius. In this way, a template layer formed of $FASnI_3$ is formed on the glass substrate. When the spin coat method is employed, a drop of a poor solvent may be put onto the glass substrate during the spin coat. An example of the poor solvent is toluene, chlorobenzene, or diethyl ether.

Next, the second solution and the glass substrate on which the template layer has been formed are heated to a temperature which falls within a range of not less than 60 degrees Celsius and not more than 180 degrees Celsius. Subsequently, the second solution is applied to the template layer by a spin coat method, and then, the substrate is heated to a temperature which falls within a range of not less than 60 degrees Celsius and not more than 180 degrees Celsius. In other words, a drop of the second solution maintained at high temperature is put on the template layer maintained at high temperature. In this way, a crystal of $FASnI_3$ containing the salt of the trivalent cation of the Group 3 element is grown on the template layer. After the spin coat, the grown crystal is subjected to heat treatment. In the heat treatment, the grown crystal may be heated at a temperature which falls within a range of not less than 40 degrees Celsius and not more than 100 degrees Celsius for not less than 15 minutes and not more than one hour. In this way, provided is the perovskite compound according to the present embodiment which has a property different from that of the template layer and in which a crystal orientation is reflected similarly to that of the template layer. It is possible that the salt of the trivalent cation of the Group 3 element is not dissolved in the second solution at room temperature. For example, it is possible that the salt is not dissolved in the solvent in a case where the amount of the salt is too much compared to the amount of the solvent or where the salt has low solubility in the solvent. In such a case, the salt of the trivalent cation of the Group 3 element is left undissolved in the second solution and is dispersed in the second solution so as to disperse fine particles of the salt of the trivalent cation of the Group 3 element in the photoabsorber layer.

Hereinafter, a fabrication method of the perovskite compound according to the present embodiment by a spin coat method other than the ITC method will be described.

First, $SnI_2$, FAI, and the salt of the trivalent cation of the Group 3 element are added to an organic solvent to provide a mixture solution. An example of the organic solvent is DMSO. The molar concentration of $SnI_2$ may be not less than 0.8 mol/L and not more than 2.0 mol/L or may be not less than 0.8 mol/L and not more than 1.0 mol/L. The molar concentration of FAI may be not less than 0.4 mol/L and not more than 2.0 mol/L or may be not less than 0.4 mol/L and not more than 1.15 mol/L. The molar concentration of the salt of the trivalent cation of the Group 3 element may be more than 0 mol/L and not more than 1.0 mol/L or may be more than 0 mol/L and not more than 0.5 mol/L.

Next, using the heating device, the mixture solution is heated to a temperature which falls within a range of not less than 40 degrees Celsius and not more than 180 degrees Celsius to dissolve $SnI_2$, FAI, and the salt of the trivalent cation of the Group 3 element in the organic solvent. In this way, a third solution is provided. Subsequently, the provided third solution is left at rest at room temperature.

Then, the third solution is applied to a glass substrate by a spin coat method. Then, the substrate is heated to a temperature which falls within a range of not less than 40 degrees Celsius and not more than 130 degrees Celsius for not less than 15 minutes and not more than one hour. In this way, the perovskite compound according to the present embodiment is provided. When the spin coat method is employed, a drop of a poor solvent may be put onto the substrate during the spin coat. An example of the poor solvent is toluene, chlorobenzene, or diethyl ether.

Each of the first-third solutions may contain a quencher material such as tin fluoride within a range of not less than 0.05 mol/L and not more than 0.4 mol/L. The quencher material prevents vacancies from being generated in the perovskite compound according to the present embodiment. The reason for the generation of the vacancies in the perovskite compound is, for example, (i) an increase in Sn vacancy or (ii) an increase in $Sn^{4+}$ due to oxidation of $Sn^{2+}$.

(Perovskite Solar Cell)

Hereinafter, the embodiment of the perovskite solar cell according to the present disclosure will be described.

The solar cell according to the present embodiment comprises a first electrode, a second electrode, a photoabsorber layer located between the first electrode and second electrode. The first electrode faces the second electrode in such a manner that the photoabsorber is present between the first electrode and second electrode. At least one electrode selected from the group consisting of the first electrode and the second electrode is light-transmissive. In the instant specification, the sentence "Electrode is light-transmissive" means that not less than 10 percent of light having a wavelength of 200-2,000 nanometers travels through the electrode at a wavelength included therein. The photoabsorber layer includes the photoabsorber of the present embodiment. Since the solar cell according to the present embodiment includes the photoabsorber according to the present embodiment, the solar cell according to the present embodiment has high conversion efficiency. Hereinafter, seven structure examples of the solar cells (first example-seventh example) and the fabrication method thereof will be described with reference to the drawings.

(First Example of Solar Cell)

Figure 3:
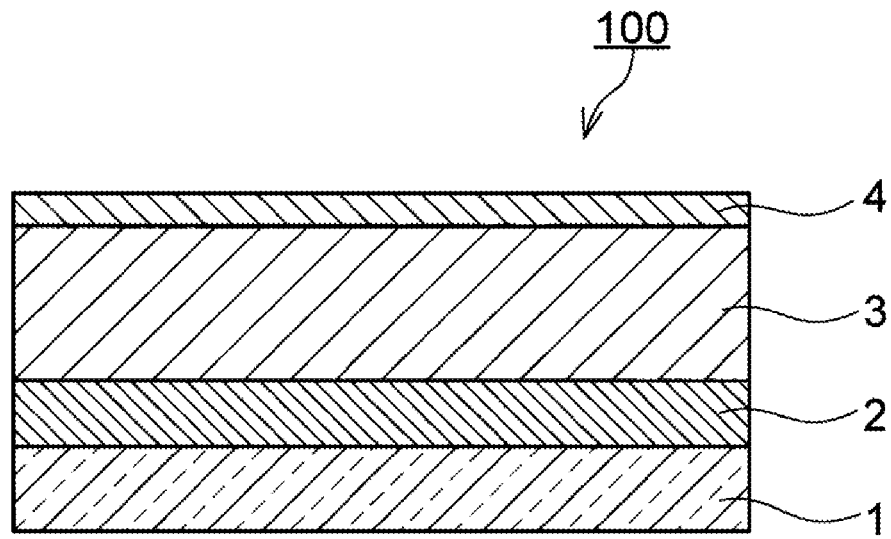
FIG. 3 is a cross-sectional view of the first example of the solar cell according to the present embodiment.

FIG. 3 is a cross-sectional view of the first example of the solar cell according to the present embodiment.

In a solar cell 100, a first electrode 2, a photoabsorber layer 3, and a second electrode 4 are stacked on a substrate 1 in this order. The photoabsorber layer 3 contains the photoabsorber formed of the perovskite compound according to the present embodiment. The solar cell 100 does not have to comprise the substrate 1.

Hereinafter, the fundamental function effect of the solar cell 100 will be described. When the solar cell 100 is irradiated with light, the light is absorbed into the photoabsorber layer 3. As a result, holes and excited electrons are generated in the photoabsorber layer 3. The excited electrons migrate to the first electrode 2. On the other hand, the holes generated in the photoabsorber layer 3 migrate to the second electrode 4. In this way, electric current is taken out from the first electrode 2 and the second electrode 4, which serve as a negative electrode and a positive electrode, respectively.

The solar cell 100 may be fabricated, for example, by the following method. First, the first electrode 2 is formed on the substrate 1 by a chemical vapor deposition method (hereinafter, referred to as a CVD method) or a sputtering method. Next, the photoabsorber layer 3 is formed on the first electrode 2 by the spin coat method, as above described. Subsequently, the second electrode 4 is formed on the photoabsorber layer 3. In this way, the solar cell 100 is provided.

Hereinafter, elements of the solar cell 100 will be described in more detail.

(Substrate 1)

The substrate 1 holds the layers of the solar cell 100. The substrate 1 may be formed of a transparent material. An example of the substrate 1 is a glass substrate or a plastic substrate. An example of the plastic substrate is a plastic film. When the first electrode 2 has sufficient strength, the photoabsorber layer 3 and the second electrode 4 can be stacked on or above the first electrode 2. Therefore, the solar cell 100 does not have to comprise the substrate 1.

(First Electrode 2)

The first electrode 2 has electric conductivity. The first electrode 2 does not form an ohmic contact with the photoabsorber layer 3. Furthermore, the first electrode 2 has a hole block property that the holes migrating from the photoabsorber layer 3 are blocked. The hole block property is to allow only electrons generated in the photoabsorber layer 3 to travel through the first electrode 2 and to prevent holes generated in the photoabsorber layer 3 from traveling through the first electrode 2. The material having the hole block property is a material having a higher Fermi energy than the energy at the upper end of the valence band of the photoabsorber layer 3. The above material may have a higher Fermi energy than the photoabsorber layer 3. An example of a suitable material for the first electrode 2 required to have the hole block property is aluminum.

The first electrode 2 is light-transmissive. Light from visible light to near-infrared light passes through the first electrode 2, for example. The first electrode 2 may be formed of a transparent and electrically-conductive metal oxide and/or nitride. An example of the material for the first electrode 2 is (i) titanium oxide doped with at least one selected from the group consisting of lithium, magnesium, niobium, and fluorine;

(ii) gallium oxide doped with at least one selected from the group consisting of tin and silicon;

(iii) gallium nitride doped with at least one selected from the group consisting of silicon and oxygen;

(iv) indium-tin composite oxide;

(v) tin oxide doped with at least one selected from the group consisting of antimony and fluorine;

(vi) zinc oxide doped with at least one selected from the group consisting of boron, aluminum, gallium, and indium; or (vii) a composite thereof.

The first electrode 2 may be formed by providing a pattern through which light passes using a non-transparent material. An example of the pattern through which the light passes is a line (namely, a stripe), a wave, a grid (namely, a mesh), or a punching metal pattern on which a lot of fine through holes are arranged regularly or irregularly. When the first electrode 2 has the above-mentioned pattern, light can travel through a part in which an electrode material is absent. An example of the non-transparent material is platinum, gold, silver, copper, aluminum, rhodium, indium, titanium, iron, nickel, tin, zinc, or alloy containing at least two selected therefrom. An electrically-conductive carbon material may be used as the non-transparent material.

Light-transmissivity of the first electrode 2 is, for example, not less than 50%, or not less than 80%. A wavelength of the light which passes through the first electrode 2 is dependent on a wavelength of the light which is absorbed into the photoabsorber layer 3. The first electrode 2 has a thickness of, for example, not less than 1 nanometer and not more than 1,000 nanometers.

(Photoabsorber Layer 3)

The photoabsorber layer 3 contains the photoabsorber according to the present embodiment. In other words, the photoabsorber of the photoabsorber layer 3 includes the perovskite compound according to the present embodiment. The photoabsorber layer 3 has a thickness, for example, not less than 100 nanometers and not more than 10 micrometers, which is dependent on the magnitude of light absorption of the photoabsorber layer 3. The photoabsorber layer 3 may have a thickness of not less than 100 nanometers and not more than 1,000 nanometers. The photoabsorber layer 3 may be formed by cutting a layer containing the perovskite compound. The photoabsorber layer 3 may have the template layer formed of $FASnI_3$ and the perovskite compound formed on the template layer.

(Second Electrode 4)

The second electrode 4 has electrical conductivity. The second electrode 4 does not form ohmic contact with the photoabsorber layer 3. Furthermore, the second electrode 4 has an electron block property that the electrons migrating from the photoabsorber layer 3 are blocked. The electron block property is to allow only holes generated in the photoabsorber layer 3 to travel through the second electrode 4 and to prevent electrons generated in the photoabsorber layer 3 from traveling through the second electrode 4. The material having the electron block property is a material having a lower Fermi energy than the energy at the lower end of the conduction band of the photoabsorber layer 3. The above material may have a lower Fermi energy than the photoabsorber layer 3. An example of a suitable material for the second electrode 4 required to have the electron block property is platinum, gold, or a carbon material such as graphene.

(Second Example of Solar Cell)

Figure 4:
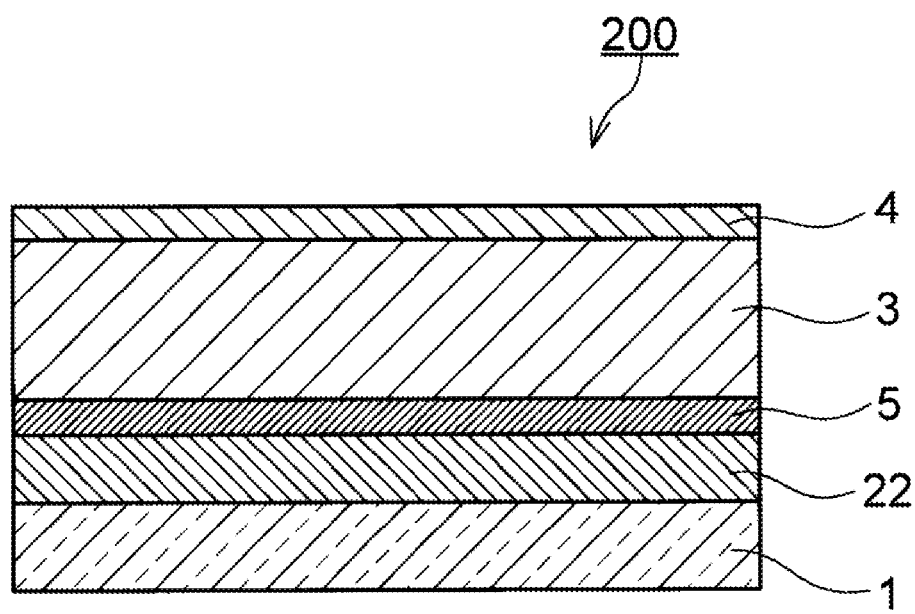
FIG. 4 is a cross-sectional view of the second example of the solar cell according to the present embodiment.

FIG. 4 is a cross-sectional view of the second example of the solar cell according to the present embodiment. Unlike the solar cell 100 shown in FIG. 3, the solar cell 200 comprises an electron transport layer 5. The common referential signs are assigned to the elements each having the same function and configuration as that of the solar cell 100 and the description thereof will be omitted.

In the solar cell 200, a first electrode 22, the electron transport layer 5, the photoabsorber layer 3, and the second electrode 4 are stacked on the substrate 1 in this order. The solar cell 200 does not have to comprise the substrate 1.

Hereinafter, the fundamental function effect of the solar cell 200 will be described. When the solar cell 200 is irradiated with light, the light is absorbed into the photoabsorber layer 3. As a result, holes and excited electrons are generated in the photoabsorber layer 3. The excited electrons migrate through the electron transport layer 5 to the first electrode 22. On the other hand, the holes generated in the photoabsorber layer 3 migrate to the second electrode 4. In this way, electric current is taken out from the first electrode 22 and the second electrode 4, which serve as a negative electrode and a positive electrode, respectively.

Since the solar cell 200 is provided with the electron transport layer 5, the first electrode 22 does not have to have the hole block property that the holes migrating from the photoabsorber layer 3 are blocked. Therefore, the range of the choice of the material of the first electrode 22 is expanded.

The solar cell 200 may be fabricated in the same way as that of the solar cell 100 shown in FIG. 3. The electron transport layer 5 may be formed on the first electrode 22 by a sputtering method.

Hereinafter, elements of the solar cell 200 will be described in more detail.

(First Electrode 22)

The first electrode 22 has electric conductivity. The first electrode 22 may have the same configuration as the first electrode 2. Since the solar cell 200 comprises the electron transport layer 5, the first electrode 22 does not have to have the hole block property that the holes migrating from the photoabsorber layer 3 are blocked. In other words, the material of the first electrode 22 may be a material capable of being in ohmic contact with the photoabsorber layer 3.

The first electrode 22 is light-transmissive. Light from visible light to near-infrared light passes through the first electrode 22, for example. The first electrode 22 may be formed of a transparent and electrically-conductive metal oxide and/or nitride. An example of the material for the first electrode 22 is (i) titanium oxide doped with at least one selected from the group consisting of lithium, magnesium, niobium, and fluorine;

(ii) gallium oxide doped with at least one selected from the group consisting of tin and silicon;

(iii) gallium nitride doped with at least one selected from the group consisting of silicon and oxygen;

(iv) indium-tin composite oxide;

(v) tin oxide doped with at least one selected from the group consisting of antimony and fluorine;

(vi) zinc oxide doped with at least one selected from the group consisting of boron, aluminum, gallium, and indium; or (vii) a composite thereof.

The material of the first electrode 22 may be a non-transparent material. In this case, similarly to the case of the first electrode 2, the first electrode 22 is formed so as to have a pattern through which light travels. An example of the non-transparent material is platinum, gold, silver, copper, aluminum, rhodium, indium, titanium, iron, nickel, tin, zinc, or alloy containing at least two selected therefrom. An electrically-conductive carbon material may be used as the non-transparent material.

Light-transmissivity of the first electrode 22 is, for example, not less than 50%, or not less than 80%. A wavelength of the light which passes through the first electrode 22 is dependent on a wavelength of the light which is absorbed into the photoabsorber layer 3. The first electrode 22 has a thickness of, for example, not less than 1 nanometer and not more than 1,000 nanometers.

(Electron Transport Layer 5)

The electron transport layer 5 contains a semiconductor. The electron transport layer 5 may be formed of a semiconductor having a bandgap of not less than 3.0 eV. Visible light and infrared light travel through the electron transport layer 5 formed of the semiconductor having a bandgap of not less than 3.0 eV to reach the photoabsorber layer 3. An example of the semiconductor is an organic or inorganic n-type semiconductor.

An example of the organic n-type semiconductor is an imide compound, a quinone compound, fullerene, or derivative of fullerene. An example of the inorganic n-type semiconductor is a metal oxide, a metal nitride, or a perovskite oxide. An example of the metal oxide is an oxide of Cd, Zn, In, Pb, Mo, W, Sb, Bi, Cu, Hg, Ti, Ag, Mn, Fe, V, Sn, Zr, Sr, Ga, Si, or Cr. $TiO_2$ is desirable. An example of the metal nitride is GaN. An example of the perovskite oxide is $SrTiO_3$ or $CaTiO_3$.

The electron transport layer 5 may be formed of a material having a bandgap of more than 6.0 eV. An example of the material having a bandgap of more than 6.0 eV is a halide of an alkali metal or alkali-earth metal (e.g., lithium fluoride or calcium fluoride), an alkali-earth metal oxide such as magnesium oxide, or silicon dioxide. In this case, to ensure the electron transport property, the electron transport layer 5 has a thickness, for example, not more than 10 nanometers.

The electron transport layer 5 may include a plurality of layers each formed of a material different to each other.

(Third Example of Solar Cell)

Figure 5:
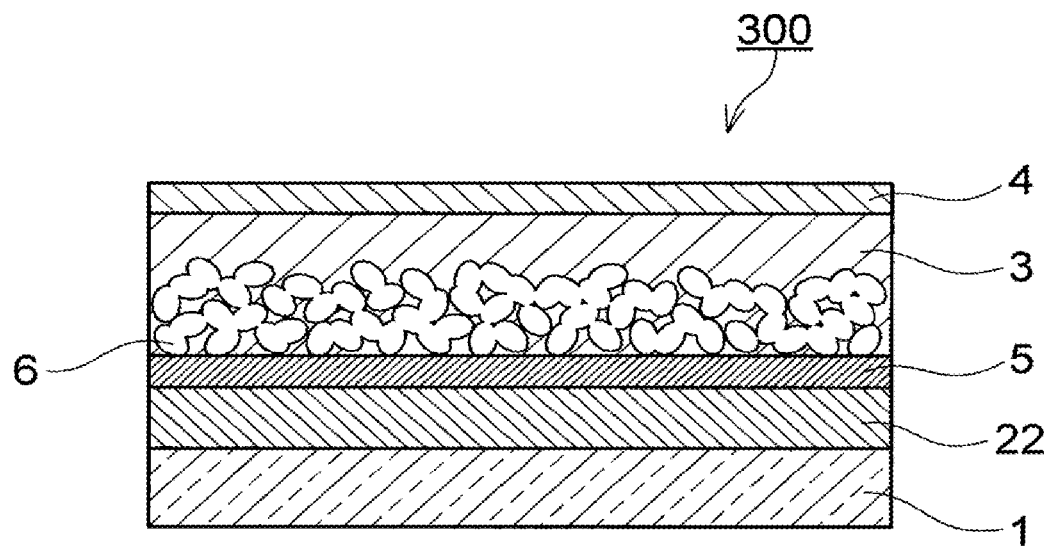
FIG. 5 is a cross-sectional view of the third example of the solar cell according to the present embodiment.

FIG. 5 is a cross-sectional view of the third example of the solar cell according to the present embodiment. Unlike the solar cell 200 shown in FIG. 4, the solar cell 300 comprises a porous layer 6. The common referential signs are assigned to the elements each having the same function and configuration as that of the solar cell 200 and the description thereof will be omitted.

In the solar cell 300, the first electrode 22, the electron transport layer 5, the porous layer 6, the photoabsorber layer 3, and the second electrode 4 are stacked on the substrate 1 in this order. The porous layer 6 contains a porous material. The porous material includes a pore. The solar cell 300 does not have to comprise the substrate 1.

The pore included in the porous layer 6 communicates from a part which is in contact with the photoabsorber layer 3 to a part which is in contact with the electron transport layer 5. The pore included in the porous layer 6 is filled with the material of the photoabsorber layer 3. The material of the photoabsorber layer 3 is in contact with the surface of the electron transport layer 5. Therefore, since the photoabsorber layer 3 is in contact with the electron transport layer 5, electrons migrate directly therebetween.

Hereinafter, the fundamental function effect of the solar cell 300 will be described. When the solar cell 300 is irradiated with light, the light is absorbed into the photoabsorber layer 3. As a result, holes and excited electrons are generated in the photoabsorber layer 3. The excited electrons migrate through the electron transport layer 5 to the first electrode 22. On the other hand, the holes generated in the photoabsorber layer 3 migrate to the second electrode 4. In this way, electric current is taken out from the first electrode 22 and the second electrode 4, which serve as a negative electrode and a positive electrode, respectively.

The porous layer 6 provided on the electron transport layer 5 facilitates the formation of the photoabsorber layer 3. In other words, the material of the photoabsorber layer 3 enters the pore included in the porous layer 6. In this way, the porous layer 6 becomes a foothold of the photoabsorber layer 3. So, the material of the photoabsorber layer 3 is hardly repelled or clumped on the surface of the porous layer 6. Therefore, the photoabsorber layer 3 can be formed as a uniform film.

(Porous Layer 6)

The porous layer 6 becomes a foothold of the formation of the photoabsorber layer 3. The porous layer 6 does not prevent the photoabsorber layer 3 from absorbing the light. In addition, the porous layer 6 does not prevent the electrons from migrating from the photoabsorber layer 3 to the electron transport layer 5. A length of light path of the light passing through the photoabsorber layer 3 is increased due to light scatter caused by the porous layer 6. It is believed that the amounts of the electrons and holes generated in the photoabsorber layer 3 are increased with increase in the length of the light path.

The porous layer 6 contains the porous material. An example of the porous material is a porous material in which insulative or semiconductor particles are connected. An example of the material of the insulative particles is aluminum oxide or silicon oxide. An example of the material of the semiconductor particles is an inorganic semiconductor. The example of the inorganic semiconductor is a metal oxide (including a perovskite oxide), a metal sulfide, or a metal chalcogenide. An example of the metal oxide is an oxide of Cd, Zn, In, Pb, Mo, W, Sb, Bi, Cu, Hg, Ti, Ag, Mn, Fe, V, Sn, Zr, Sr, Ga, Si, or Cr. $TiO_2$ is desirable. An example of the perovskite oxide is $SrTiO_3$ or $CaTiO_3$. An example of the metal sulfide is CdS, ZnS, $In_2S_3$, SnS, PbS, $Mo_2S$, $WS_2$, $Sb_2S_3$, $Bi_2S_3$, $ZnCdS_2$, or $Cu_2S$. An example of the metal chalcogenide is CdSe, CsSe, $In_2Se_3$, $WSe_2$, HgS, SnSe, PbSe, or CdTe.

The porous layer 6 may have a thickness of not less than 0.01 micrometer and not more than 10 micrometers, or not less than 0.1 micrometer and not more than 1 micrometer. The porous layer 6 may have a large surface roughness. In particular, a surface roughness coefficient defined by a value of an effective area/a projected area may be not less than 10, or not less than 100. The effective area is an actual area of a surface of the object. The projected area is an area of a shadow of an object formed posteriorly to the object when light travelling from the front of the object is incident on the object. The effective area can be calculated from a volume calculated from the projected area and the thickness of the object, a specific surface area of the material which constitutes the object, and a bulk density of the object. The specific surface area is measured, for example, by a nitrogen adsorption method.

The solar cell 300 may be fabricated in the same way as that of the solar cell 200. The porous layer 6 is formed on the electron transport layer 5, for example, by a coating method.

The photoabsorber layer 3 is formed as below. A template layer formed of $FASnI_3$ is formed on the porous layer 6. The stacking structure including the photoabsorber layer 3 and the porous layer 6 is heated to high temperature. Then, a solution heated to the high temperature is applied by a spin-coat method to the porous layer 6. Finally, a crystal of the perovskite compound is grown in the solution to form the photoabsorber layer 3. The formation method and the crystal growth method for a template layer are not limited to the above. Another method (e.g., a spin-coat method using the third solution, which has been described above) may be employed.

(Fourth Example of Solar Cell)

Figure 6:
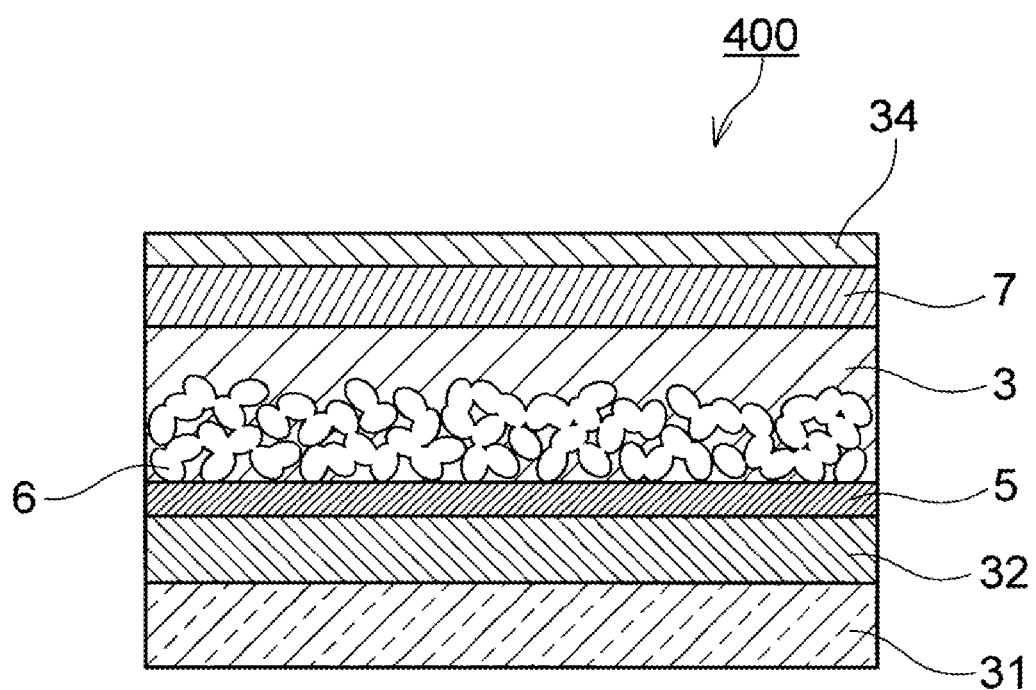
FIG. 6 is a cross-sectional view of the fourth example of the solar cell according to the present embodiment.

FIG. 6 is a cross-sectional view of the fourth example of the solar cell according to the present embodiment. Unlike the solar cell 300 shown in FIG. 5, the solar cell 400 comprises a hole transport layer 7. The common referential signs are assigned to the elements each having the same function and configuration as that of the solar cell 300 and the description thereof will be omitted.

In the solar cell 400, a first electrode 32, the electron transport layer 5, the porous layer 6, the photoabsorber layer 3, the hole transport layer 7, and a second electrode 34 are stacked on a substrate 31 in this order. The solar cell 400 does not have to comprise the substrate 31.

Hereinafter, the fundamental function effect of the solar cell 400 will be described.

When the solar cell 400 is irradiated with light, the light is absorbed into the photoabsorber layer 3. As a result, holes and excited electrons are generated in the photoabsorber layer 3. The excited electrons migrate to the electron transport layer 5. On the other hand, the holes generated in the photoabsorber layer 3 migrate to the hole transport layer 7. The electron transport layer 5 and the hole transport layer 7 are electrically connected to the first electrode 32 and the second electrode 34, respectively. In this way, electric current is taken out from the first electrode 32 and the second electrode 34, which serves as a negative electrode and a positive electrode, respectively.

Since the solar cell 400 is provided with the hole transport layer 7 which is present between the photoabsorber layer 3 and the second electrode 34, the second electrode 34 does not have to have the electron block property that the electrons migrating from the photoabsorber layer 3 are blocked. Therefore, the range of the choice of the material of the second electrode 34 is expanded.

Hereinafter, each element of the solar cell 400 will be described. The description of the elements common to those of the solar cell 300 will be omitted.

(First Electrode 32 and Second Electrode 34)

As above described, the second electrode 34 does not have to have the electron block property that the electrons migrating from the photoabsorber layer 3 are blocked. In other words, a material of the second electrode 34 may be a material capable of being in contact with the photoabsorber layer 3. Therefore, the second electrode 34 can be formed so as to be light-transmissive.

At least one electrode selected from the group consisting of the first electrode 32 and the second electrode 34 is light-transmissive and configured in the same way as the first electrode 2 of the solar cell 100.

At least one electrode selected from the group consisting of the first electrode 32 and the second electrode 34 does not have to be light-transmissive. In other words, a light-transmissive material is not necessarily used. The at least one electrode does not have to have a pattern including an opening part through which light travels.

(Substrate 31)

The substrate 31 may have the same configuration as the substrate 1 of the solar cell 100 shown in FIG. 1. When the second electrode 34 is light-transmissive, the substrate 31 does not have to be light-transmissive. An example of a material for the substrate 31 is a metal, a ceramic, or a resin material having a small light-transmissivity.

(Hole Transport Layer 7)

The hole transport layer 7 is composed of an organic substance or an inorganic semiconductor. The hole transport layer 7 may have a plurality of layers each composed of a material different from each other.

In light of the low resistance, it is desirable that the hole transport layer 7 has a thickness of not less than 1 nanometer and not more than 1,000 nanometers, more desirably, not less than 10 nanometers and not more than 50 nanometers. Within this range, the hole transport property is provided sufficiently to generate electric power with high efficiency.

As a formation method of the hole transport layer 7, a coating method or a printing method can be employed. An example of the coating method is a doctor blade method, a bar coating method, a spraying method, a dip coating method, or a spin coating method. An example of the printing method is a screen printing method. If necessary, the hole transport layer 7 is provided by forming a film using a mixture of plural materials, and then, applying a pressure to the film or sintering the film. When the material of the hole transport layer 7 is an organic low-molecular material or an inorganic semiconductor, the hole transport layer 7 may be formed by a vacuum evaporation method.

The hole transport layer 7 may contain a supporting electrolyte and a solvent. The supporting electrolyte and the solvent stabilize the holes included in the hole transport layer 7.

An example of the supporting electrolyte is an ammonium salt or an alkali metal salt. An example of the ammonium salt is tetrabutylammonium perchlorate, tetraethylammonium hexafluorophosphate, an imidazolium salt, or a pyridinium salt. An example of the alkali metal salt is lithium perchlorate or potassium tetrafluoroborate.

The solvent contained in the hole transport layer 7 may have high ionic conductivity. As the solvent, both an aqueous solvent and an organic solvent may be used. In view of more stabilization of the solvent, the organic solvent is desirable. An example of the organic solvent is a heterocyclic compound solvent such as tert-butylpyridine, pyridine, or n-methylpyrrolidone.

As a solvent, an ionic liquid may be used solely. Alternatively, as a solvent, a mixture of an ionic liquid and another solvent may be used. The ionic liquid is desirable in view of its low volatility and high fire retardancy.

An example of the ionic liquid is an imidazolium-type ionic liquid such as 1-ethyl-3-methylimidazolium tetracyanoborate, a pyridine-type ionic liquid, an alicyclic amine-type ionic liquid, an aliphatic amine-type ionic liquid, or an azonium amine-type ionic liquid.

(Fifth Example of Solar Cell)

Figure 7:
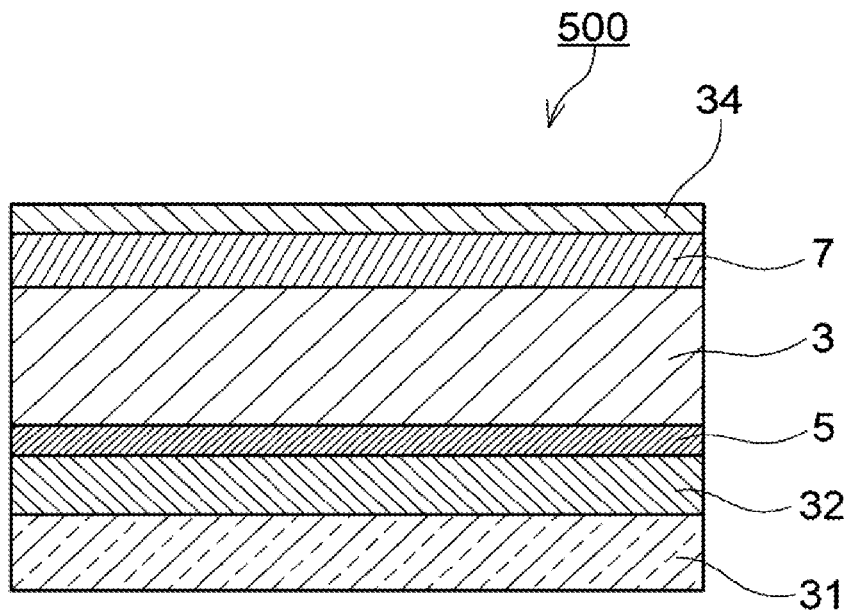
FIG. 7 is a cross-sectional view of the fifth example of the solar cell according to the present embodiment.

FIG. 7 is a cross-sectional view of the fifth example of the solar cell according to the present embodiment. Unlike the solar cell 400 shown in FIG. 6, the solar cell 500 does not comprise the porous layer 6. The common referential signs are assigned to the elements each having the same function and configuration as that of the solar cell 400 and the description thereof will be omitted.

In the solar cell 500, the first electrode 32, the electron transport layer 5, the photoabsorber layer 3, the hole transport layer 7, and the second electrode 34 are stacked on the substrate 31 in this order. The solar cell 500 does not have to comprise the substrate 31.

Hereinafter, the fundamental function effect of the solar cell 500 will be described.

When the solar cell 500 is irradiated with light, the light is absorbed into the photoabsorber layer 3. As a result, holes and excited electrons are generated in the photoabsorber layer 3. The excited electrons migrate to the electron transport layer 5. On the other hand, the holes generated in the photoabsorber layer 3 migrate to the hole transport layer 7. The electron transport layer 5 and the hole transport layer 7 are electrically connected to the first electrode 32 and the second electrode 34, respectively. In this way, electric current is taken out from the first electrode 32 and the second electrode 34, which serve as a negative electrode and a positive electrode, respectively.

(Sixth Example of Solar Cell)

Figure 8:
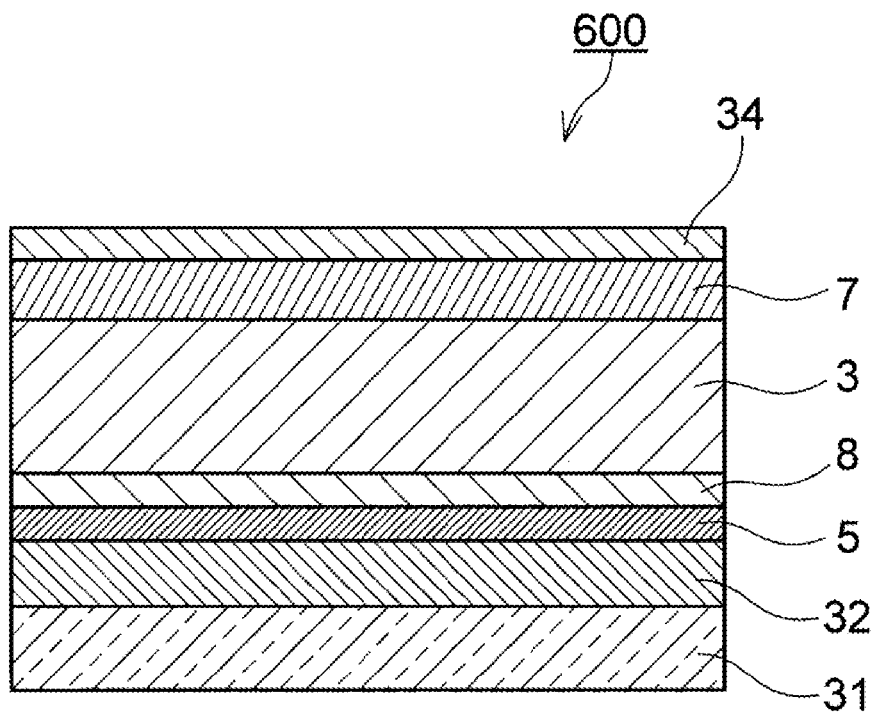
FIG. 8 is a cross-sectional view of the sixth example of the solar cell according to the present embodiment.

FIG. 8 is a cross-sectional view of the sixth example of the solar cell according to the present embodiment. Unlike the solar cell 500 shown in FIG. 7, the solar cell 600 comprises a template layer 8. In the solar cell 600, the template layer 8 and the photoabsorber layer 3 may serve as the photoabsorber layer. In other words, the photoabsorber layer comprises the template layer 8 (hereinafter, which may be referred to as a "first layer") and the photoabsorber layer 3 (hereinafter, which may be referred to as a "second layer"). The common referential signs are assigned to the elements each having the same function and configuration as that of the solar cell 500 and the description thereof will be omitted.

In the solar cell 600, the first electrode 32, the electron transport layer 5, the template layer 8, the photoabsorber layer 3, the hole transport layer 7, and the second electrode 34 are stacked on the substrate 31 in this order. The solar cell 600 does not have to comprise the substrate 31.

Hereinafter, the fundamental function effect of the solar cell 600 will be described.

When the solar cell 600 is irradiated with light, the light is absorbed into the photoabsorber layer 3. As a result, holes and excited electrons are generated in the photoabsorber layer 3. The excited electrons migrate to the template layer 8. The electrons which have migrated to the template layer 8 further migrate to the electron transport layer 5. On the other hand, the holes generated in the photoabsorber layer 3 migrate to the hole transport layer 7. The electron transport layer 5 and the hole transport layer 7 are electrically connected to the first electrode 32 and the second electrode 34, respectively. In this way, electric current is taken out from the first electrode 32 and the second electrode 34, which serve as a negative electrode and a positive electrode, respectively.

Hereinafter, each element of the solar cell 600 will be described. The description of the elements common to those of the solar cell 500 will be omitted.

(Template Layer 8)

The template layer 8 contains a perovskite compound which is represented by the composition formula $ABX_3$ (where, A is a monovalent cation, B is a divalent cation, and X is a halogen anion) and has a perovskite structure. The perovskite compound contained in the template layer 8 is, for example, $FASnI_3$. The perovskite compound contained in the template layer 8 may have different composition from that of the perovskite compound according to the present embodiment. The template layer 8 has a thickness of, for example, not less than 50 nanometers and not more than 1,000 nanometers.

The template layer 8 is formed on the electron transport layer 5. The template layer 8 may be formed by the method described in the section of the fabrication method of the photoabsorber layer 3. The photoabsorber layer 3 may be formed by the fabrication method described in the third example.

(Seventh Example of Solar Cell)

Figure 9:
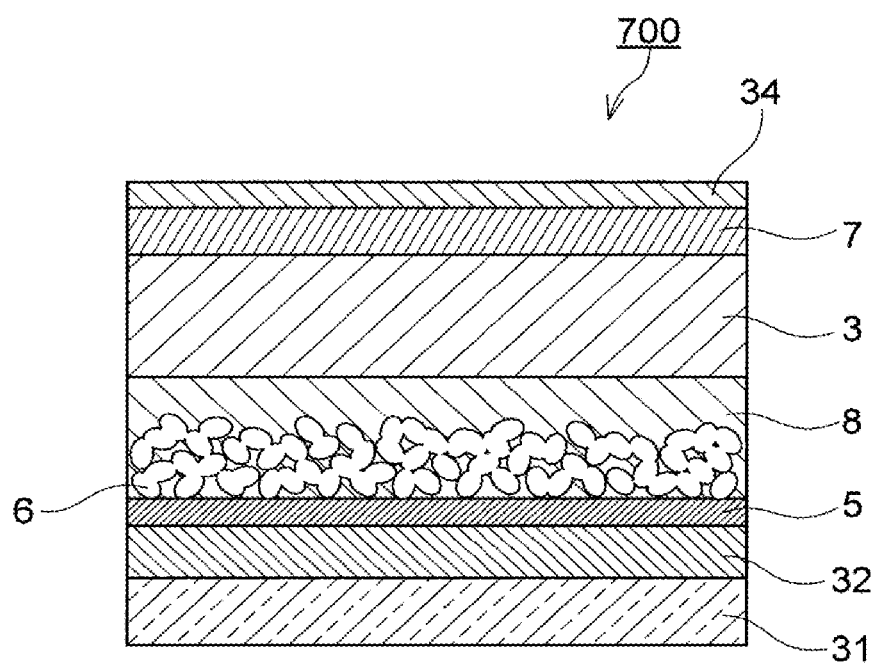
FIG. 9 is a cross-sectional view of the seventh example of the solar cell according to the present embodiment.

FIG. 9 is a cross-sectional view of the seventh example of the solar cell according to the present embodiment. Unlike the solar cell 600 shown in FIG. 8, the solar cell 700 comprises the porous layer 68. The common referential signs are assigned to the elements each having the same function and configuration as that of the solar cell 600 and the description thereof will be omitted.

In the solar cell 700, the first electrode 32, the electron transport layer 5, the porous layer 6, the template layer 8, the photoabsorber layer 3, the hole transport layer 7, and the second electrode 34 are stacked on the substrate 31 in this order. The porous layer 6 contains the porous material. The porous material includes the pore. The solar cell 700 does not have to comprise the substrate 31.

The pore included in the porous layer 6 communicates from a part which is in contact with the template layer 8 to a part which is in contact with the electron transport layer 5. The pore included in the porous layer 6 is filled with the material of the template layer 8. The material of the photoabsorber layer 3 is in contact with the surface of the electron transport layer 5. Therefore, since the template layer 8 is in contact with the electron transport layer 5, electrons migrate directly therebetween.

Hereinafter, the fundamental function effect of the solar cell 700 will be described. When the solar cell 700 is irradiated with light, the light is absorbed into the photoabsorber layer 3. As a result, holes and excited electrons are generated in the photoabsorber layer 3. The excited electrons migrate to the template layer 8. The electrons which have migrated to the template layer 8 further migrate to the electron transport layer 5. On the other hand, the holes generated in the photoabsorber layer 3 migrate to the hole transport layer 7. The electron transport layer 5 and the hole transport layer 7 are electrically connected to the first electrode 32 and the second electrode 34, respectively. In this way, electric current is taken out from the first electrode 32 and the second electrode 34, which serve as a negative electrode and a positive electrode, respectively.

The porous layer 6 provided on the electron transport layer 5 facilitates the formation of the template 8. This is the same as the effect that the porous layer 6 facilitates the formation of the photoabsorber layer 3, as described in the section of the third example of the solar cell.

EXAMPLES

The present disclosure will be described in more detail with reference to the following examples. In the following inventive examples 1-6, comparative example 1, and referential examples 1-2, perovskite solar cells were fabricated. Furthermore, their properties were evaluated.

Inventive Example 1

A perovskite solar cell having the same configuration as the perovskite solar cell 400 shown in FIG. 6 was fabricated. The details of the perovskite solar cell of the inventive example 1 will be described below.

Substrate 31: Glass substrate

First electrode 32: $SnO_2$ layer doped with indium (surface resistance: 10 ohms/sq.)

Electron transport layer 5: Titanium oxide (thickness: 30 nanometers)

Porous layer 6: Porous titanium oxide

Photoabsorber layer 3: $CH(NH_2)_2SnI_3+Y^{3+}$

Hole transport layer 7: Polytriallylamine (hereinafter, referred to as "PTAH", product of Aldrich)

Second electrode 34: Au (thickness: 80 nanometers)

The perovskite solar cell of the inventive example 1 was fabricated as below.

First, as the substrate 31, an electrically conductive glass substrate on which a $SnO_2$ layer doped with indium was formed was prepared. The substrate was a product of Nippon Sheet Glass Co., Ltd. The electrically conductive glass substrate had a thickness of 1 millimeter. The $SnO_2$ layer doped with indium served as the first electrode 32.

As the electron transport layer 5, a titanium oxide layer having a thickness of 30 nanometers was formed on the first electrode 32 by a sputtering method.

Next, highly pure titanium oxide powder having a mean primary particle diameter of 20 nanometers (product of Mikuni-color Ltd.) was dispersed in ethyl cellulose to prepare a titanium oxide paste for screen printing.

The titanium oxide paste was applied to the electron transport layer 5, and then, the paste was dried. Furthermore, the titanium oxide paste was sintered in air at temperature of 500 degrees Celsius for 30 minutes to form the porous layer 6 composed of a porous titanium oxide layer having a thickness of 0.2 micrometers.

Next, a DMSO solution containing $SnI_2$ and formamidinium was prepared. The concentration of $SnI_2$ was 1.15 mol/L. The concentration of formamidinium was also 1.15 mol/L. $YI_3$ was dissolved in the DMSO solution at temperature of 120 degrees Celsius to prepare an application solution in such manner that the concentration of $YI_3$ was 2.3 mmol/L (namely, the molar ratio of $Y^{3+}$ to Sn was equal to 0.002). Then, the application solution is applied to the porous layer 6 by a spin-coat method. Then, the substrate 31 was heated on a hot plate at temperature of 130 degrees Celsius to form the photoabsorber layer 3.

Subsequently, PTAA was dissolved in toluene to prepare a toluene solution having a PTAA concentration of 1 gram/liter. Then, the toluene solution was applied by a spin-coat method on the photoabsorber layer 3 to form the hole transport layer 7.

Finally, an Au film having a thickness of 80 nanometers was deposited on the hole transport layer 7 to form the second electrode 34. In this way, the solar cell of the inventive example 1 was fabricated. All the steps included in the fabrication of the solar cell were performed in a $N_2$ globe box having an oxygen concentration of not more than 5 ppm.

Inventive Examples 2-3

Except that the molar ratio of Y to Sn was adjusted as shown in Table 1, the solar cells of the inventive examples 2-3 were fabricated similarly to the inventive example 1.

Inventive Examples 4-6

Except that $ScI_3$ was added to the DMSO solution in place of $YI_3$ and that the molar ratio of Sc to Sn was adjusted as shown in Table 1, the solar cells of the inventive examples 4-6 were fabricated similarly to the inventive example 1.

Comparative Example 1

Except that $YI_3$ was not added to the DMSO solution, the solar cell of the comparative example 1 was fabricated similarly to the inventive example 1.

Referential Examples 1-2

Except that $BiI_3$ was added to the DMSO solution in place of $YI_3$ and that the molar ratio of Bi to Sn was adjusted as shown in Table 1, the solar cells of the referential examples 1-2 were fabricated similarly to the inventive example 1.

The solar cells of the inventive examples 1-6, the comparative example 1, and the referential examples 1-2 were irradiated with light having illuminance of 100 mW/cm² with a solar simulator to measure a current-voltage property. In addition, open voltage, short circuit current density, and photoelectric conversion efficiency of the solar cells were calculated on the basis of the stabilized current-voltage property. The evaluation results were shown in Table 1.

doped with a trivalent cation of the Group 3 element allows the conversion efficiency of the solar cell to be increased.

INDUSTRIAL APPLICABILITY

The photoabsorber of the present disclosure is useful, for example, as a material which is used for a photoabsorber of the solar cell provided on a roof.

REFERENTIAL SIGNS LIST 1, 31 Substrate
2, 22, 32 First Electrode
3 Photoabsorber Layer
4, 34 Second Electrode
5 Electron Transport Layer
6 Porous Layer
7 Hole Transport Layer
8 Template Layer
100, 200, 300, 400, 500, 600, 700 Solar Cell

The invention claimed is:
1. A solar cell, comprising:
a first electrode;
a second electrode; and
a photoabsorber layer containing a trivalent cation of a Group 3 element and a perovskite compound represented by the composition formula $ABX_3$,
where
A represents a monovalent cation,
B represents a divalent cation including a Sn cation, and
X represents a halogen anion,

TABLE 1

| | Doped with | Molar Ratio of Element with which the Photoabsorber was Doped to Sn | Open Voltage (mV) | Short Circuit Current Density (mA/cm²) | Conversion Efficiency (%) |
|---|---|---|---|---|---|
| Comparative Example 1 | No doped | | 330 | 17.1 | 2.5 |
| Referential Example 1 | $Bi^{3+}$ | 0.001 | 190 | 3.6 | 0.4 |
| Referential Example 2 | $Bi^{3+}$ | 0.01 | 170 | 1.8 | 0.4 |
| Inventive Example 1 | $Y^{3+}$ | 0.002 | 320 | 20.6 | 3.1 |
| Inventive Example 2 | $Y^{3+}$ | 0.006 | 330 | 21.8 | 3.7 |
| Inventive Example 3 | $Y^{3+}$ | 0.02 | 340 | 20.9 | 3.3 |
| Inventive Example 4 | $Sc^{3+}$ | 0.002 | 380 | 22.2 | 4.0 |
| Inventive Example 5 | $Sc^{3+}$ | 0.006 | 360 | 21.8 | 3.7 |
| Inventive Example 6 | $Sc^{3+}$ | 0.02 | 390 | 23.4 | 4.8 |

As is clear from Table 1, in the inventive examples 1-6, since the solar cells includes the photoabsorber doped with the trivalent cation of the Group 3 element, the solar cell has high short circuit current density and high conversion efficiency. On the other hand, in the comparative example 1 or the referential examples 1-2, since the solar cells includes the photoabsorber which has not doped with the trivalent cation of the Group 3 element or which has doped with a Bi cation, the solar cell has lower short circuit current density and lower conversion efficiency than the solar cell of the inventive examples 1-6. As just described, the photoabsorber wherein
the photoabsorber layer is disposed between the first electrode and the second electrode,
at least one selected from the group consisting of the first electrode and the second electrode is light-transmissive, and
the Group 3 element is selected from the group consisting of yttrium and scandium.
2. The solar cell according to claim 1, wherein
a molar ratio of the trivalent cation to the Sn cation is more than 0.0002 and not more than 0.02.

3. The solar cell according to claim 2, wherein the molar ratio of the trivalent cation to the Sn cation is not less than 0.002 and not more than 0.02.

* * * * *